United States Patent [19]

Jones et al.

[11] 4,034,313
[45] July 5, 1977

[54] MICROSTRIP GUNN OSCILLATOR WITH VARACTOR TUNING

[75] Inventors: Stewart Barry Jones; Keith Rushworth Williams, both of Stockport, England

[73] Assignee: U.S. Philips Corporation, New York, N.Y.

[22] Filed: May 14, 1975

[21] Appl. No.: 577,315

[30] Foreign Application Priority Data

May 20, 1974  United Kingdom ............. 22477/74

[52] U.S. Cl. .................................. 331/96; 331/99; 331/107 G; 331/177 V; 333/1.1; 333/24.1; 333/82 R
[51] Int. Cl.² ....................... H03B 7/14; H03B 9/12
[58] Field of Search ...... 331/96, 99, 107 R, 107 G, 331/177 V; 343/5 R, 17.1; 333/1.1, 24.1, 82R

[56] References Cited

UNITED STATES PATENTS

| 3,454,946 | 7/1969 | Warren et al. ............ 331/107 G X |
| 3,831,109 | 8/1974 | Leiby ........................... 331/107 G |
| 3,868,594 | 2/1975 | Cornwell et al. .......... 331/107 G X |

OTHER PUBLICATIONS

King et al., Electronics, Feb. 3, 1969, pp. 94–96.
Newton, et al. Mullard Research Laboratories Annual Review, 1972, pp. 26–30.

*Primary Examiner*—Siegfried H. Grimm
*Attorney, Agent, or Firm*—Frank R. Trifari

[57] ABSTRACT

A microwave oscillator arrangement comprising a microstrip resonator, a Gunn oscillator mounted outside the substrate of the resonator, a varactor diode connected in series with the Gunn oscillator and the resonator, and means for applying adjustable bias to the varactor diode.

20 Claims, 3 Drawing Figures

MICROSTRIP GUNN OSCILLATOR WITH VARACTOR TUNING

This invention relates to a microwave oscillator. The oscillator is particularly but not exclusively suitable for applications in which a high degree of frequency stability is required, such as a Doppler radar which may be required to operate within a predetermined narrow frequency range. The invention further relates to such a Doppler radar.

The invention further relates to a protective metallic contact suitable for an unencapsulated semiconductor device, such as a Gunn device; a Gunn device may be used as the power source in the oscillator.

A Doppler radar is described in our U.K. Pat. specification No. 1,279,583. In this radar, the Gunn device power source is mounted on a gold tab which is supported on the gyromagnetic substrate on which the microwave circuit is formed. This arrangement has been found not to constitute a very satisfactory heat sink for the Gunn device, as it has a rather high thermal resistance; there is a consequent shortening of the operating life of the Gunn device. Other difficulties have been experienced with the life of the Gunn device, as will be described later.

Furthermore, it has been found that the filter circuits used in the radar to isolate the microwave circuit from the D.C. Gunn supply voltage terminal and the low-frequency Doppler output terminal have rather low rejection factors. The filter circuits, which comprise lumped-element capacitors and inductors, have satisfactory characteristics when measured in isolation under ideal conditions, but these characteristics are markedly poorer when the filters are used in the radar, the circuits apparently being sensitive to mis-matches. It has also been found that there is some difficulty in satisfactorily reproducing the interdigital capacitors: the very narrow strips of photoresist material, which are required to mask the spaces between the electrode fingers in the course of making the capacitor, are rather easily dislodged, and there is thus a significant possibility of at least one conductive bridge being formed across the capacitor.

The radar also does not comprise means for stabilising or tuning the oscillating frequency of the Gunn device, and therefore, it may be rather difficult to set up a number of such radars so that the operating frequency of each lies within a predetermined narrow band, for example there being inevitably some variation in characteristics from one Gunn device to another. Similarly, there is no means of compensating for changes in the operating frequency with temperature.

Improved forms of a microwave oscillator and a Doppler radar incorporating the oscillator have been described in an article in the "Mullard Research Laboratories Annual Review, 1972" on pages 26-30. The article describes an oscillator comprising a Gunn device and a varactor in series with the Gunn device and with a port of the circulator to which the oscillator supplies power; the varactor is conductively connected to the Gunn device and the circular port. The oscillator further comprises an open-circuited line capacitively coupled to the said port of the circulator to provide a high-Q frequency-stabilising resonator. The varactor provides a means of tuning the oscillator by variation of the bias voltage applied to it, and hence of its capacitance; this in turn allows the use of a thermistor varactor biasing network to stabilise the operating frequency against variations with temperature. Furthermore, the filter circuits used comprise quasi-distributed rather than lumped elements; these have been found to provide a better performance.

The invention will now be described with reference to the accompanying drawings, in which.

The Doppler radar is intended for use in the frequency band of $10.687 \pm 0.012$ GHz, and comprises a microstrip circuit formed on a gryomagnetic substrate SU, 1 cm square. The material of the substrate is available from Transtech Inc. under their reference G 1021, and is a ferrite doped with gadolinium to improve the temperature stability of its magnetic properties. The substrate has the desirable highly polished surface (a roughness of 5 microinches or less), a thickness of 0.5 mm and a dielectric constant $\epsilon$ of 15.2.

Figure 1:
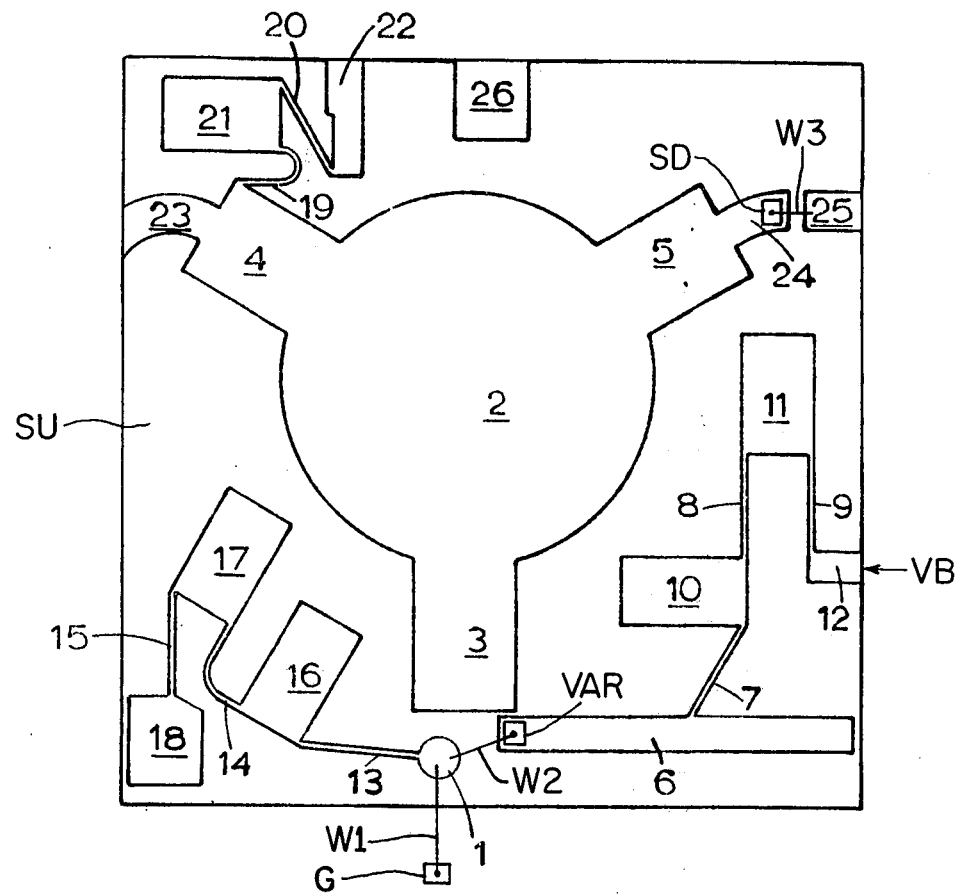
FIG. 1 shows a circuit pattern for a Doppler radar embodying the invention.

The circuit will be described by reference to FIG. 1. The circuit comprises a circular bonding pad 1 and a circulator 2 having first, second and third ports 3, 4 and 5 respectively.

An open-circuited microstrip line 6 having an impedance of 40 ohms and a physical length of 4.80 mm forms part of a high-Q resonator circuit and is arranged so that one end thereof is adjacent, and thereby capacitively coupled to, port 3 of the circulator. The length of the portion of the line 6 immediately adjacent the end of the microstrip line forming port 3 is 0.25 mm, and the gap between them, as defined by photolithography, is 20 microns.

The total length of the line 6, including a correction of +0.16 mm for its free end (i.e. the end remote from the circulator), amounts to approximately 0.56 microstrip wavelengths.

A quasi-distributed five-element filter network is connected to line 6 approximately a quarter-wavelength from its free end, and comprises narrow, high-impedance, inductive portions 7, 8 and 9 alternating with broad, low-impedance, capacitive portions 10 and 11; the filter network terminates in a bonding pad 12. An analogous filter network comprising narrow portions 13, 14 and 15 alternating with broad portions 16 and 17 is connected to pad 1 and terminates in a pad 18. A three-element filter comprising narrow portions 19 and 20 and a broad portion 21 is connected between port 4 of the circulator and a bonding pad 22.

Port 4 of the circulator is extended to the adjacent edge of the substrate by a length 23 of 40 ohm microstrip line to form a match for a 50 ohm output to an aerial, and port 5 is extended by a length 24 of similar line. The circuit also includes an earthed pad 25. A further pad 26 is provided, but does not form part of the circuit, being required for the process of manufacturing the circuit.

The circuit is manufactured as follows:-

Onto the whole of each major surface of the substrate is evaporated a 500 Angstrom thick layer of titanium, followed by a 3000 Angstrom thick layer of gold. One surface (hereinafter denoted the upper face) is then coated with photoresist material which is exposed through a mask which is then treated to leave uncovered those regions which are to form the required circuit as shown in FIG. 1. These regions are now electroplated with a 5 micron layer of gold, electrical contact in the plating bath being made to the pad 26. (It should at this point be made clear that the portions of the photolithographic mask corresponding to pads 12, 22, 25 and 26 of the circuit extend beyond the corresponding edges of the ferrite substrate in order to ensure that in the finished circuit, the pads extend substantially up to the edges of the substrate). The photoresist material is then stripped. A ten micron layer of gold is now electroplated onto the lower face of the substrate to form the ground plane. The titanium/gold layers remaining on the supper surface in the regions previously covered by photoresist are etched away to leave the desired circuit pattern.

A length of gold foil is wrapped around the edge of the circuit at pad 25, and is welded to the pad and the ground plane so as to earth the pad.

It has been found the width of the gap between line 6 and port 3 decreases with increasing height above the surface of the substrate following the electroplating of the five micron thick gold layer; thus, although the width of the gap is 20 microns adjacent the substrate, as mentioned above, its widtth at the upper surface of the gold layer is only 10 microns. This effect of the sideways growth of the electroplated layer is far less pronounced with a thinner layer of, say, three microns, but a thickness of five microns is considered necessary to be adequately greater than the skin depth of the microwave energy.

The substrate is mounted in a housing of a die-cast alloy known as Mazak 3 which is predominatly zinc; the ground plane is bonded to the housing by a silver epoxy resin of low resistivity, the substrate being correctly located by means of metal bars which are adjacent two adjoining edges and which are secured in the housing by screws.

The oscillator comprises as its power source a Gunn device G mounted externally in the plane of the substrate SU on the end of a gold-plated copper screw conductively secured in the housing; the Gunn device G lies 1.7 mm from the bonding pad 1, and is electrically connected thereto by a 25 micron diameter gold wire W1 bonded by thermo-compression to a top contact on the device and to the pad 1. The Gunn device G and its mounting will be described in detail later. The oscillator further comprises a varactor diode VAR (a p-n junction device) in the form of an unencapsulated 300 micron square chip, the lower contact of which is mechanically and electrically connected by a gold or silver epoxy resin to the upper surface of line 6 at its end adjacent port 3. The varactor VAR has a circular upper contact having a diameter of the order of 20 microns which is electrically connected by a 10 micron diameter gold wire W2 to the pad 1.

The Doppler radar further comprises a mixer diode SD (a Schottky-barrier device) in the form of an unencapsulated chip which is mounted at the free end of line 24 on the third port of the circulator. (The device is similar to those commercially available in encapsulated form under the Mullard type numbers BAV 75, BAT 10 and BAT 11.) As with the varactor diode, the lower contact of the chip is bonded to the line by a conductive epoxy resin, and its upper circular contact, also having a diameter of the order of 20 microns, is bonded by a 10 micron diameter gold wire W3 to the pad 25.

The magnetic field for the circulator is provided by two cylindrical permanent magnets (not shown) located in the housing coaxially with the circular portion of the circulator and respectively above and below the substrate. Each magnet is made of Philips "Magnadur 330", and has a diameeter of 6.4 mm and a length of 5.1 mm; such a magnet provides a field of approximately 1100 Gauss immediately adjacent an end face. The lower face of the upper magnet is spaced 0.5 mm above the substrate; the upper face of the lower magnet contacts the ground plane. The sense of the magnetic field is such that the circulation of microwave energy is clockwise when viewed from above, as in FIG. 1.

The radar is suitably electrically shielded by the housing.

It may under certain conditions of use be desirable to provide magnetic shielding of the radar.

The Gunn device G is operated with a supply of about minus 8 volts applied between the pad 18 and earth, the pad 18 being connected to the top contact of the device via the low-pass filter comptising circuit portions 13–17, pad 1 and the 25 micron bonding wire; the lower contact of the device is of course earthed through the screw on which it is mounted.

The varactor diode VAR is operated with a bias voltage applied between pads 12 and 18, the former being positive with respect to the latter.

The mixer diode is operated with a bias current of about minus 30 microamps supplied through the pad 22 from which the a.f. Doppler output is of course also taken.

The output from port 4 of the circulator to an aerial may be taken, for example, by means of a 50-ohm coaxial line extending perpendicular to the edge of the substrate with an exposed length of 0.8mm of the central conductor of the coaxial line overlying and in electrical contact with the line 23. If the aerial is, for example, a waveguide horn, the other end of the central conductor of the coaxial line may form a probe into a waveguide connected to the horn.

The operation of the circuit is as follows:

The oscillator comprises the Gunn diode G, pad 1, the varactor diode VAR, the 25 and 10 micron diameter bond wires W1 and W2 inter-connecting these elements, and the line 6. The oscillator supplies power to port 3 of the circulator through the capacitive coupling of the port and the line 6 at the end thereof to which power is fed from the Gunn device. Most of this power circulates from port 3 to port 4, whence it is coupled to the aerial. Signal power (within the operating frequency band of the radar) received by the aerial such as, for example a fraction of the transmitted power reflected by a moving target, is similarly coupled to port 4 whence it circulates to port 5. A small portion of the power supplied to port 3 (about minus 20dB) reaches port 5 through the circulator and provides a local-oscillator signal which is combined in the mixer diode with the received signal to produce an output signal including a Doppler component having a frequency proportional to the velocity of the moving target. As mentioned above, the Doppler output signal is taken from pad 22.

The operating frequency of the radar may be tuned by varying the bias on the varactor diode VAR. The capacitance of the diode, which at zero bias is approximately 0.6 – 0.7pF, can be varied by a factor of approximately two with a bias of some 10 volts; this provides a tuning range of about 300MHz. The output power, dependent on the particular Gunn device used, is normally in the range of 4 – 8 mW, and is typically 5 mW;

the output power is substantially constant (within ±1dB) over the whole tuning range. These characteristics are in marked contrast to those of the device described in the "Research Laboratories Annual Review, 1972." In the latter device, the tuning range is some 2GHz, the oscillator "locking on" to the resonant line only over a range of some 50–80 MHz in which the output power is reduced by about 3dB; in the oscillator of the present invention, the oscillator is effectively "locked" to the line over its whole tuning range. This locked condition provides in each oscillator a loaded Q-factor of the order of 70.

It may be noted that if the earlier device is provided with a line of the same length as that in the described embodiment of the present invention, the frequency at which this locking occurs is approximately 9.3GHz.

It will be appreciated that whereas in the earlier device, variations in the width of the coupling gap between the line and the circulator port will have little effect on the output power but a marked effect on the Q-factor, the reverse is rather the case for the described embodiment of the invention.

It may also be noted that the "locking" arrangement used in the earlier device makes the power output of the device sensitive to temperature (thermistor compensation being used to keep the operating frequency almost constant), since the central frequency of the 50–80MHz band in which locking is obtained varies as the effective electrical length of the resonant line varies with temperature. Thus, as the temperature changes, the operating frequency remaining substantially constant, the device will tend to go out of lock, the Q-factor will decrease, and the power output will increase.

The characteristics of the oscillar embodying the present invention make it very much easier to set up the radar to operate at a predetermined frequency. It has been found that, for a particular varactor bias voltage, the effect of differences such as the variation in characteristics of the Gunn devices, in the precise position of the varactor chip on the resonator 6 (this position is not critical), and in the lengths of the bond wires, is such that when the radar is first set up, the operating frequency will in the great majority of cases lie within the range of approximately 10.4 – 10.8GHz. In appropriate cases, the operating frequency might of course then be adjusted to the desired value of 10.687GHz by altering the varactor bias. However, it may be desirable to provide a means of compensating for changes in frequency with temperature (due mainly to alterations in the effective electrical length of the line 6) by including one or more thermistors in the varactor biassing supply; since the rate of change of frequency with varactor bias itself varies with the bias (from about 30MHz/volt at a bias of minus 2 volts to about 10MHz/volt at a bias of minus 10 volts), a particularly simple supply network can be used if the oscillator is set up to operate with a varactor bias which is predetermined for a particular temperature, such as 20° C.

Figure 2:
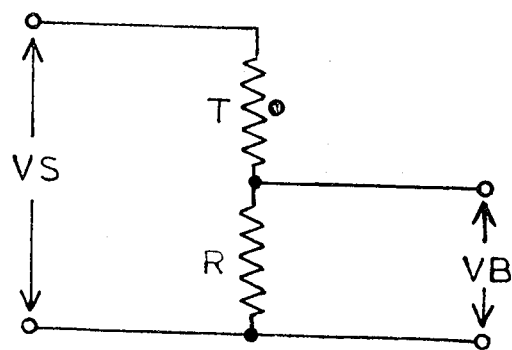
FIG. 2 illustrates a varactor biassing network for the oscillator of the radar.

Such a network is shown in FIG. 2; it is a potential divider comprising a thermistor T in series with a resistor R across which the varactor bias voltage VB is taken. A suitable thermistor is Mullard type 2322 640 90005 and a corresponding suitable value for the resistor R is 390 kilo-ohms. The resistance of the thermistor is roughly 700 kilo-ohms at 0° C, 300 kilo-ohms at 20° C and 120 kilo-ohms at 40° C. With for example a supply voltage VS of 4 volts across the potential divider, the voltage VB is approximately 2 ± 1 volts over the temperature range of 20° ± 20° C. The increase with temperature in the magnitude of the bias voltage and consequent decrease in the capacitance of the varactor compensates for the increase in effective electrical length of the line so that the rate of change of frequency is of the order of only 300°–400° kHz/° C (as against 1.0 – 1.5 MHz/° C without thermistor compensation).

Thus, provided the correct frequency can be obtained initially at say 20° C, the operating frequency will remain well within 12MHz of that frequency over the range of 0° – 40° C. This correct initial frequency can be obtained by varying the length either of the .25 micron bond wire between the Gunn device and the pad 1, or of the line 6. In each case, it is suitable to start with an excessive length and reduce it until the correct frequency is obtained; this may suitably, in the case of the bond wire, be done by altering the point at which the wire is bonded to the pad 1; the effect of bonding the wires to either of two diametrically opposite points on pad 1 respectively near to and remote from the Gunn device is a change in frequency of the order of 200MHz. In the case of the line 6, the frequency may be adjusted by trimming the end remote from the circulator port 3, for example with a laser beam. A final fine adjustment of the frequency may be made by altering the voltage VS across the varactor biassing network within a range of about ± 1 volt. Thus the varactor is used both as a means of fine tuning of the oscillator and a means whereby temperature compensation can be provided. In applications for which such strict frequency control is not required, the varactor could therefore of course be omitted.

The frequency might of course also be altered by altering the operating voltage of the Gunn device: the frequency pushing in the range of minus 7.5 – 8.5 volts is about 20MHz/volt. However, operation at a lower voltage may cause difficulty in low-temperature starting, and operation at a higher voltage may cause an undesirably high power dissipation.

In such an oscillator with temperature compensation, no problems have been experienced as regards mode jumping over the stated temperature range. As part of the Doppler radar, second harmonic output has been measured as approximately minus 40dB and spurious (i.e. non-harmonic) output as more than 30dB down. A.M. noise in a band of 1Hz to 1kHz on each side of the carrier frequency has been measured as minus 90dB with respect to the carrier.

The starting voltage for the Gunn device is about minus 6.5 volts at 20° C.

The five-element filter networks provide about 35dB rejection, and the three-element filter provides about 20dB rejection.

By way of comparison, it may be mentioned that an oscillator without a temperature-compensating varactor biassing network could be tuned over the range of 10.45 – 10.75 GHz by varying the varactor bias voltage between zero and minus ten volts. The varactor was then removed and the 10 micron wire from pad 1 was bonded to the line 6 in the region previously occupied by the varactor chip: the operating frequency was now 10.55 GHz.

It is of course in general desirable to keep the bond wires in the oscillator short since their inductances contribute towards limiting the highest frequency of operation attainable with the oscillator. (Also, relatively long wires are a potential cause of variation between one oscillator and another.) For the same reason, it is preferable to use wires of as large a diameter as convenient: in the present case, 25 micron wire could be used to connect pad 1 to the Gunn device as the latter has a relatively large top contact, but wire of only 10 microns has been used to connect pad 1 to the varactor as the contact on the latter is far smaller.

It will be appreciated that the isolating effect on the oscillator of the circulator in the Doppler radar is desirable in applications such as that described in which a high degree of frequency stability is required; without the isolator, a VSWR of 1.5 would cause a frequency shift of the order of 25MHz.

For applications other than that described, for example where a simple, isolated, stable oscillator is required, a similar circuit may be used with the third port 5 of the circulator terminated in a matched load. A means of integrating this on the ferrite substrate is to use a a nickel/chromium "seed" layer instead of the titanium layer mentioned above. A square area can be defined by means of the photolithographic mask to connect line 24 and earth pad 25; evaporation of the nichrome layer can be monitored so that it is discontinued when the resistance per square of the deposited layer equals the required characteristic impedance, in this case 50 ohms. The above-mentioned square area is then masked off before the remainder of the circuit is covered with gold, and subsequently provides the desired matched termination.

The described Doppler radar circuit is believed to be suitable to be adapted for operation at any desired frequency in the range of approximately 9.1 – 10.9GHz simply by altering the length of the line 6. For frequencies outside this range, the dimensions of the circulator ports will also require adjustment to provide correct matching.

Forms of stabilisers (forming part of the high-Q oscillator circuit) other than the described line 6 may be used: for example, a curved line may be used. (This would allow a longer line, for a lower operating frequency, to be fitted onto a substrate of the same size.)

Arrangements for coupling out power from the line 6 other than that described may be used. For example, the line may be arranged with its end edge adjacent a side edge of the line forming the port 3 of the circulator, or an overlay capacitor arrangement may be used.

The impedance of the line 6 is not critical, but if a different impedance is used, corresponding adjustment may have to be made in the matching of the oscillator.

The capacitance of the bonding pad 1 is of the order of 0.05pF, and its effect on the operation of the oscillator is therefore very small.

The unencapsulated Gunn device used in the oscillator is a modification of that commercially available in encapsulated form under the Mullard type number CXY 11. As in the radar described in specification 1,279,583, it was considered desirable to use an unencapsulated device in the oscillator in order to eliminate the stray capacitance and inductance associated with the encapsulation package, and to reduce cost. However, it was found that using the unencapsulated chip of the CXY 11, the performance of the diode deteriorated over a period of several weeks of use owing, it is believed, to corrosion of the tin/silver top contact on the diode by sulphur compounds absorbed from the atmosphere, until the diode ceased to oscillate.

Figure 3:
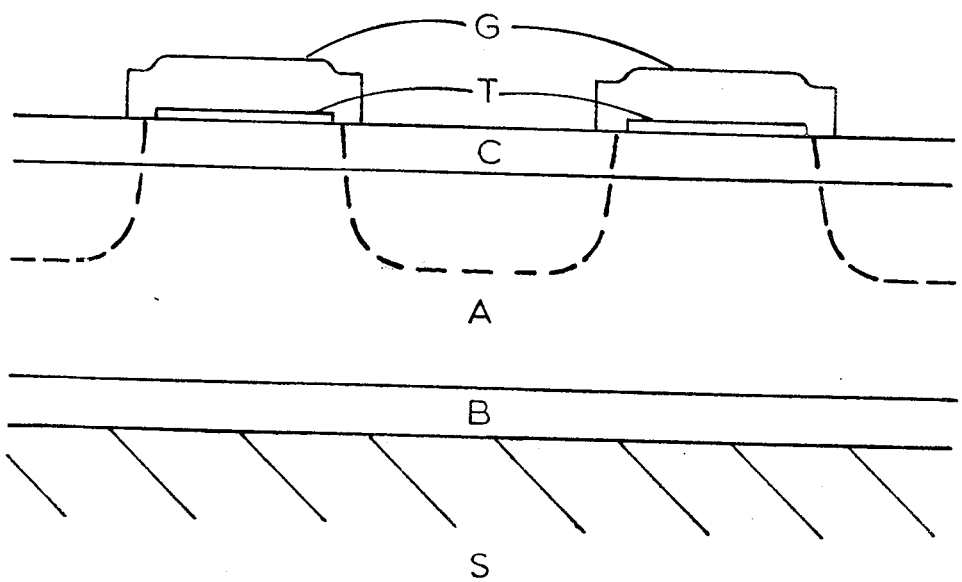
FIG. 3 illustrates schematically a gallium arsenide slice for the manufacture of Gunn devices embodying a further aspect of the invention.

The original and improved form of Gunn device will now be described in detail with reference to FIG. 3, which illustrates schematically a gallium arsenide slice used for the formation of a number of devices. The slice comprises successively a 90 micron thick $N^{++}$ substrate S, a 2 micron $n^+$ buffer layer B, a 9 micron $n$ active layer A and a 2 micron $n^+$ contact layer C. Spaced circular top contacts T having a diameter of approximately 60 microns are formed by successive evaporation of a 500 Angstrom thick layer of tin followed by a 5000 Angstrom thick layer of silver. The contact is alloyed at a temperature of 600 °C for one minute; this causes the tin to diffuse into the gallium arsenide to provide a highly doped, ohmic connection.

In the original devices, the upper surface of the exposed gallium arsenide is etched to a depth of about 6 microns to remove the $n^+$ contact layer. The lower surface of the slice is provided by evaporation with a 5000 Angstrom thick layer of "525 alloy" (an alloy of gold, germanium and silver having a melting point of 525° C). The slice is then diced into 300 micron square chips.

In the improved devices, before the etching is carried out, the tin/silver contact T is protected against subsequent atmospheric corrosion by a layer of gold G. In this case, both the flat upper surface and the circumferential surface of each contact are covered by defining 80 micron diameter apertures, coaxial with the contacts, in photoresist material and electroplating a 2 micron thick layer of gold onto both the contacts and the surrounding annular areas of gallium arsenide. The photoresist material is then removed and the slice etched, as indicated by dashed lines, provided with a bottom contact layer and diced as before.

An improved device provided with the protective gold layer (but no encapsulation) has been operated continuously at 20° C in an atmosphere of hydrogen sulphide; there has been no substantial deterioration after 1000 hours. By way of comparison, an original form of device without the gold layer (and again with no encapsulation) ceased to function under these conditions within 24 hours. An improved device has been operated continuously at 1 watt dissipation (the normal working condition in the radar) in air at an ambient temperature of 70° C, giving a junction temperature of approximately 250° C; again, there has been no substantial deterioration after 1000 hours.

This technique applied to the Gunn device will no doubt also prove to be applicable to other forms of device, particularly of course when they are to be used without encapsulation. The gold layer provides the additional advantage of being particularly suitable for bonding a connecting lead.

The capacitance of the improved Gunn device is about 0.3pF.

As mentioned before, the Gunn device chip is, in the Doppler radar, bonded to a gold-plated copper screw; this is done by means of a preformed gold/germanium alloy layer having a melting point of 360° C intermediate the bottom contact of the Gunn device and the flat tip of the screw. The screw is placed, inverted, on a hot plate such as to provide a temperature of 420° C at the tip of the screw. A jet of cooling gas is blown onto the tip to lower its temperature while the preformed layer and the Gunn chip are successively placed on the tip. The gas jet is turned off and the Gunn chip is pressed into the molten alloy and gently vibrated to ensure correct seating. The gas jet is turned on again and the screw with the mounted chip is cooled.

This mounting arrangement has a thermal resistance of about 170° C/watt which is mainly due to the chip itself (the screw itself having a resistance of only 7½° C/watt) and which is comparable to the encapsulated CXY 11 device. On the other hand, the thermal resistance of the mounting arrangement described in U.K. Pat. No. 1,279,583 is nearer 250° C/watt.

We claim:

1. A microwave oscillator arrangement comprising a dielectric substrate, a microstrip resonator formed on a portion of the substrate, a negative-resistance oscillator device external to the resonator, and means for coupling the negative-resistance oscillator device to the resonator, whereby substantially all the R.F. power produced by the negative-resistance oscillator device is fed into the resonator, means for coupling R.F. power out of the resonator into a load, and a variable reactance connected in series between the negative-resistance oscillator device and the resonator whereby to adjust the operating frequency of the oscillator arrangement.

2. An oscillator arrangement as claimed in claim 1 wherein the resonator is a length of microstrip line.

3. An oscillator arrangement as claimed in claim 2 wherein the microstrip line is open circuited.

4. An oscillator arrangement as claimed in claim 3 wherein the variable reactance is connected to one end of the microstrip line.

5. An oscillator arrangement as claimed in claim 1 wherein the means for coupling power out of the resonator comprises a capacitor.

6. An oscillator arrangement as claimed in claim 5 wherein the capacitor comprises a gap between the resonator and a further strip line.

7. An oscillator arrangement as claimed in claim 1 wherein the means for coupling R.F. power out of the resonator is immediately adjacent a connection of the means for coupling the negative-resistance device to the resonator.

8. An oscillator arrangement as claimed in claim 1 wherein the means for coupling the negative-resistance device to the resonator comprises a wire.

9. An oscillator arrangement as claimed in claim 1 wherein the variable reactance is a varactor.

10. An oscillator arrangement as claimed in claim 1 wherein the negative-resistance device is an unencapsulated Gunn device.

11. An oscillator arrangement as claimed in claim 10 wherein the Gunn device is mounted on a thermally conductive screw.

12. An oscillator arrangement as claimed in claim 1 comprising means for varying the reactance so as to reduce a variation of operating frequency with temperature.

13. An oscillator arrangement as claimed in claim 12 wherein the means for varying the reactance comprises a thermistor.

14. An oscillator arrangement as claimed in claim 1 comprising a distributed low-pass filter for applying a D.C. voltage to the negative-resistance device.

15. An oscillator arrangement as claimed in claim 1 comprising a distributed low-pass filter for applying a D.C. voltage to the variable reactance.

16. An oscillator arrangement as claimed in claim 1 comprising a gyromagnetic isolating device, having a plurality of ports and wherein the means for coupling R.F. power out of the resonator is arranged to couple the R.F. power into a first port of the isolating device.

17. An oscillator arrangement as claimed in claim 16 wherein the isolating device is a three-port circulator and wherein a mixer diode is coupled to a second port of the circulator relatively isolated from the first port.

18. An oscillator arrangement as claimed in claim 17 comprising a distributed low-pass filter connected to the mixer diode.

19. An oscillator arrangement as claimed in claim 16 wherein the isolating device is a three-port circulator and wherein a matched load is connected to a second port of the circulator relatively isolated from the first port.

20. An oscillator arrangement as claimed in claim 1 wherein the resonator is formed on a ferrite substrate.

* * * * *